(12) United States Patent
Hatta et al.

(10) Patent No.: US 9,891,274 B2
(45) Date of Patent: Feb. 13, 2018

(54) DEVICE TEST METHOD

(71) Applicant: TOKYO ELECTRON LIMITED, Tokyo (JP)

(72) Inventors: Masataka Hatta, Yamanashi (JP); Kazunari Ishii, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 27 days.

(21) Appl. No.: 14/915,171

(22) PCT Filed: Aug. 1, 2014

(86) PCT No.: PCT/JP2014/070956
§ 371 (c)(1),
(2) Date: Feb. 26, 2016

(87) PCT Pub. No.: WO2015/029742
PCT Pub. Date: Mar. 5, 2015

(65) Prior Publication Data
US 2016/0209465 A1    Jul. 21, 2016

(30) Foreign Application Priority Data
Aug. 28, 2013   (JP) ................. 2013-176845

(51) Int. Cl.
*G01R 31/00*     (2006.01)
*G01R 31/28*     (2006.01)
(Continued)

(52) U.S. Cl.
CPC ..... *G01R 31/2891* (2013.01); *G01R 1/07307* (2013.01); *G01R 1/44* (2013.01); *G05B 19/234* (2013.01)

(58) Field of Classification Search
CPC ............ G01R 31/2891; G01R 1/07342; G01R 31/2887; G01R 3/00; G01R 31/2886;
(Continued)

(56) References Cited

U.S. PATENT DOCUMENTS 5,585,738 A * 12/1996 Kuji .................... G01R 31/2887
                                                     324/690
7,688,096 B2 * 3/2010 Inomata ............. G01R 31/2831
                                                     324/662
(Continued)

FOREIGN PATENT DOCUMENTS

JP    H07-297242    11/1995
JP    2000-321303   11/2000
(Continued)

OTHER PUBLICATIONS

International Search Report.

*Primary Examiner* — Vinh Nguyen

(57) ABSTRACT

A device test method performed in a substrate test apparatus which includes a mounting table for mounting thereon a substrate on which a device having an electrode is formed, the mounting table being movable by a X-direction motor and a Y-direction motor, and a probe card arranged to face the mounting table. A measuring electrode is arranged to correspond to the electrode of the device, the probe card has a probe that is engageable with the measuring electrode, and the X-direction motor or Y-direction motor generates torque to keep the mounting table from moving when measuring an electrical characteristic of the device. In the device test method, after the probe is engaged with the measuring electrode, when measuring an electrical characteristic of the device, the maximum value of the torque generated by the X-direction motor or Y-direction motor is limited to a predetermined value or less.

7 Claims, 16 Drawing Sheets

(51) Int. Cl.
*G01R 1/073* (2006.01)
*G05B 19/23* (2006.01)
*G01R 1/44* (2006.01)

(58) Field of Classification Search
CPC ............ G01R 31/2893; G01R 1/07314; G01R
1/0491; G01R 1/06711; G01R 1/06794;
G01R 1/07307; G01R 1/06727; G01R
1/06744; G01R 1/073; G01R 1/067;
G01R 1/06722; G01R 1/06738; G01R
1/07371; G01R 31/2863; G01R 35/005;
G01R 1/0408; G01R 1/0466; G01R
31/26; G01R 31/2851; G01R 31/3025;
G01R 31/311; G01R 31/31926; G01R
35/00; G01R 31/2889; G01R 31/2831;
G01R 31/2806; G01R 1/07364; G01R
25/005; G01R 31/2879; G01R 1/06705;
G01R 1/06733; G01L 27/005; G01L
5/162; G01L 5/223; G01N 19/04; G01N
21/9501; G01N 21/956; G01N 2203/04;
H01R 13/22; H01R 2201/20; H01L
2924/14; G06F 3/0338; G11C 2029/5602;
G11C 29/56
See application file for complete search history.

(56) References Cited

U.S. PATENT DOCUMENTS

| | | |
|---|---|---|
| 2002/0118029 A1 | 8/2002 | Yamasaka |
| 2009/0058446 A1* | 3/2009 | Yamamoto ......... G01R 31/2891 |
| | | 324/750.28 |
| 2009/0153170 A1 | 6/2009 | Hagihara |
| 2010/0244877 A1 | 9/2010 | Ko |
| 2013/0278279 A1* | 10/2013 | Ishii .................. G01R 31/2863 |
| | | 324/750.03 |

FOREIGN PATENT DOCUMENTS

| | | |
|---|---|---|
| JP | 2011-504658 | 2/2011 |
| KR | 10-2009-0023184 A | 3/2009 |

* cited by examiner

DEVICE TEST METHOD

CROSS REFERENCE

This application is a National Stage application of, and claims priority to, PCT Application No. PCT/JP2014/070956, filed on Aug. 1, 2014, entitled "Device Test Method," which claims priority to Japanese Patent Application No. 2013-176845, filed on Aug. 28, 2013. The foregoing patent applications are herein incorporated by reference by entirety for all purposes.

FIELD OF THE INVENTION

The present invention relates to a device test method for measuring an electrical characteristic of a device formed on a substrate.

BACKGROUND OF THE INVENTION

A prober is known as an apparatus for measuring an electrical characteristic of a semiconductor device, e.g., a power device or a memory formed on a semiconductor wafer (hereinafter, simply referred to as "wafer") W that is a substrate.

The prober includes a disk-shaped probe card 111 having a plurality of cantilever-type probe needles 110 shown in FIG. 12. As shown in FIG. 13, the prober makes each probe needle 110 of the probe card 111 contact with an electrode pad 120, which serves as a measuring electrode, arranged corresponding to each electrode of a semiconductor device, and allows a test current to flow from each of the probe needles 110 to the electrode pads 120, thereby measuring an electrical characteristic of the semiconductor device (see, e.g., Patent Document 1). At this time, a wafer W is mounted on a stage that is movable by, e.g., a linear motor, and by moving the stage, each probe needle 110 of the probe card 111 is positioned to correspond to each electrode pad 120.

In a conventional wafer, since an integration degree of a semiconductor device is not so high, it is possible to arrange each electrode pad 120 having a relatively large flat plate shape to correspond to each electrode of the semiconductor device. However, recently, an integration degree of a semiconductor device has become high and the number of electrodes of the semiconductor device has increased, so that it is difficult to arrange each electrode pad 120 to correspond to each electrode.

In response, instead of the flat plate-shaped electrode pads 120, relatively small hemispherical solder bumps 130 shown in FIG. 14A have been arranged in a high density on a wafer W to correspond to electrodes of the semiconductor device (see FIG. 14B); e.g., about 10,000 or more bumps per device are being arranged. However, the cantilever-type probe needles 110 have a limit to be miniaturized and their high density arrangement is difficult. Therefore, it is difficult to arrange a large number of probe needles 110 at the probe card in a high density.

Accordingly, in the probe card 111, instead of the cantilever-type probe needles 110, there are provided columnar probe electrodes 141 protruding downward and each having at a leading end thereof a protuberant engagement part 140. In this case, a wafer W is made to approach the probe card 111 (FIG. 15A), the probe electrodes 141 are brought into contact with the solder bumps 130 (FIG. 15B), and the engagement parts 140 are pushed into the solder bumps 130 to engage the probe electrodes 141 with the solder bumps 130 (FIG. 15C). By doing so, the probe electrodes 141 and the solder bumps 130 maintain contact with each other.

Patent Document 1: Japanese Patent Application Publication No. H7-297242

However, when the probe electrodes 141 are brought into contact with the solder bumps 130, a reaction force due to a fine misalignment between the probe electrodes 141 and the solder bumps 130 may be applied to the probe card 111, or the probe card 111 may be thermally expanded by the heat generated by current flow while the electrical characteristic of the semiconductor device is measured. Then, the probe card 111 may move along a surface of the wafer W (see a black arrow in FIG. 15C).

At this time, a moving force is applied to the solder bumps 130 due to the movement of the probe card 111 (see a white arrow in FIG. 15C) while the linear motor is operated to keep the stage from moving. Since the linear motor generates torque to offset the moving force, load occurs in the linear motor. For example, a moving force of 30 kgf or more may be generated with respect to one device, so that when the linear motor generates torque to offset the moving force, the linear motor may be overloaded to be damaged in some cases.

SUMMARY OF THE INVENTION

In view of the above, the present invention provides a device test method capable of limiting the load of a motor for moving a stage to a predetermined value or less.

In accordance with an aspect of the present invention, there is provided a device test method performed in a substrate test apparatus which includes a mounting table for mounting thereon a substrate on which a device having an electrode is formed, the mounting table being movable by a motor, and a probe card arranged to face the mounting table, wherein a measuring electrode is arranged to correspond to the electrode of the device, the probe card has a probe that is engageable with the measuring electrode, and the motor generates torque to keep the mounting table from moving when measuring an electrical characteristic of the device, the device test method including: a step of engaging the probe with the measuring electrode; and a step of limiting to a predetermined value or less a maximum value of the torque generated by the motor when measuring an electrical characteristic of the device after the engaging step.

In the device test method, the limitation of the maximum value of the torque may be canceled after measuring the electrical characteristic of the device.

In the device test method, after the engaging step and before measuring the electrical characteristic of the device, the mounting table may be moved to limit to a specific value or less a moving force which is generated and applied to the measuring electrode at the time of the engaging step.

In the device test method, the measuring electrode may be an electrode pad or a solder bump, and the probe may include a protuberant member that is engageable with the measuring electrode.

In the device test method, the mounting table may be configured to be movable in each of two directions that are orthogonal to each other on a horizontal plane, and the substrate test apparatus may have the motor corresponding to each of the two directions.

In the device test method, the predetermined value may be equal to or less than 100% of a rated output of the motor.

In the device test method, the motor may be a linear motor which is relatively moved with respect to a rail.

In the device test method, the motor may move the mounting table through a ball screw.

EFFECT OF THE INVENTION

In accordance with the present invention, after engaging the probe with the measuring electrode, when the electrical characteristic of the device is measured, a maximum value of torque, which is generated by the motor to keep the mounting table from moving, is limited to a predetermined value or less. Therefore, in a case where the probe card is thermally expanded and a moving force applied to the measuring electrode due to the thermal expansion exceeds a predetermined value, the motor allows the mounting table to move. By doing so, a reaction force due to a fine misalignment between the probe and the corresponding measuring electrode is canceled and load greater than a predetermined load value is not imposed on the motor. Consequently, the load of the motor for moving the mounting table can be limited to the predetermined load value or less.

DETAILED DESCRIPTION OF THE EMBODIMENTS

Hereinafter, embodiments of the present invention will be described with respect to the accompanying drawings.

Figure 1:
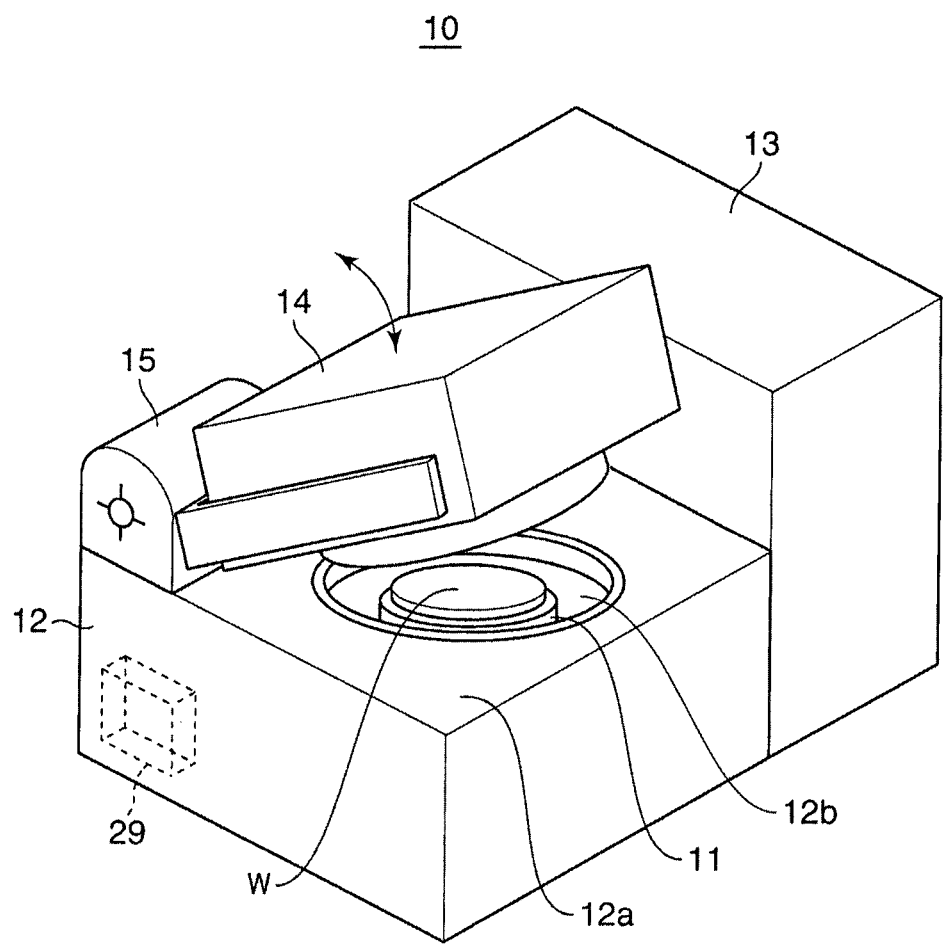
FIG. 1 is a perspective view schematically showing a configuration of a prober serving as a substrate test apparatus for performing a device test method in accordance with an embodiment of the present invention.

FIG. 1 is a perspective view schematically showing a configuration of a prober serving as a substrate test apparatus for performing a device test method in accordance with an embodiment.

In FIG. 1, a prober 10 (substrate test apparatus) includes a main body 12 which accommodates a stage 11 (mounting table) on which a wafer W is mounted, a loader 13 arranged adjacent to the main body 12, and a test head 14 arranged to cover the main body 12. The prober 10 measures electrical characteristics of a plurality of semiconductor devices formed on the wafer W having a large diameter of, e.g., 300 or 450 mm.

The main body 12 has a hollow case shape. At a ceiling portion 12a of the main body 12, an opening 12b is provided to be opened above the top of the wafer W mounted on the stage 11. A substantially disk-shaped probe card holder 16 is engaged with the opening 12b and the probe card holder 16 holds a disk-shaped probe card 17 (see FIG. 2A to be described later). Accordingly, the probe card 17 faces the wafer W. The wafer W is vacuum-sucked to the stage 11 such that the wafer W is not relatively misaligned with respect to the stage 11. Solder bumps 27 (see FIG. 5A to be described later) are arranged to correspond to electrodes in each of the semiconductor devices formed on the wafer W.

The test head 14 has a rectangular parallelepiped shape and is pivotable in an up-down direction through a hinge mechanism 15 provided at the main body 12. When the test head 14 covers the main body 12, the test head 14 is electrically connected to the probe card 17 through a contact ring (not shown). The test head 14 includes a data storage unit (not shown) which stores, as measured data, electric signals indicating the electrical characteristics of the semiconductor devices transmitted from the probe card 17, and a determination unit (not shown) which determines whether or not the semiconductor devices have an electric fault based on the measured data.

The loader 13 takes out a wafer W, on which a semiconductor device is formed, accommodated in a FOUP (not shown) that is a transfer container and mounts the wafer W on the stage 11 of the main body 12. Further, the loader 13 receives from the stage 11 a wafer W that has been subjected to the electrical characteristic test on its semiconductor device and accommodates the wafer W to the FOUP.

A plurality of probe electrodes 28 (see FIG. 5A to be described later) is arranged, on a surface of the probe card 17 facing the wafer W, to correspond to the solder bumps 27 of the semiconductor device on the wafer W. The stage 11 adjusts relative positions between the probe card 17 and the wafer W to make the solder bumps 27 of the semiconductor device contact with the respective probe electrodes 28.

When the solder bumps 27 of the semiconductor device are made to contact with the probe electrodes 28, the test head 14 supplies a test current to the semiconductor device through the probe electrodes 28 of the probe card 17. Then, the probe card 17 transmits an electric signal indicating the electrical characteristic of the semiconductor device to the data storage unit of the test head 14. The data storage unit stores the transmitted electric signal as measured data and the determination unit determines whether or not the semiconductor device that is a test target has an electric fault based on the stored measured data.

Figure 2A:
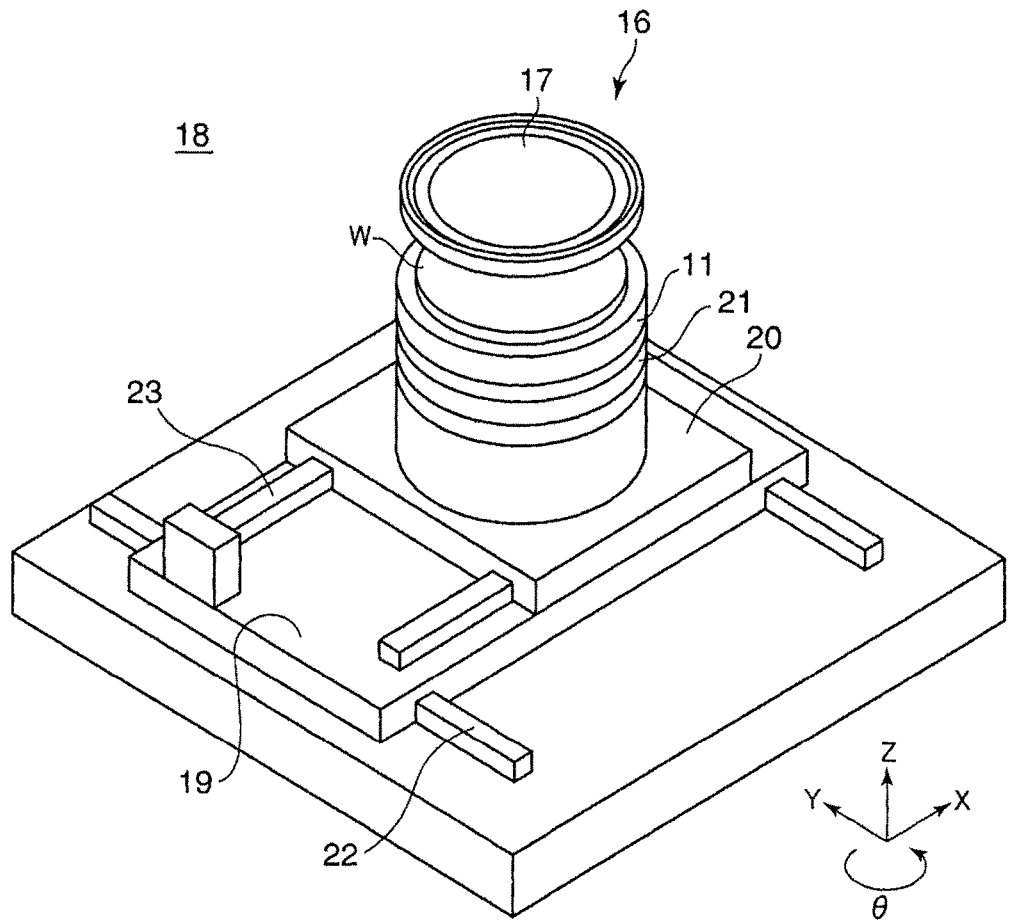
FIG. 2A is a perspective view schematically showing a configuration of a moving mechanism of a stage shown in FIG. 1.
Figure 2B:
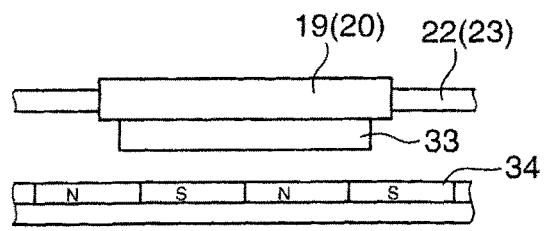
FIG. 2B is a side view schematically showing a configuration of a Y-direction motor and an X-direction motor in the moving mechanism shown in FIG. 2A.
Figure 2C:
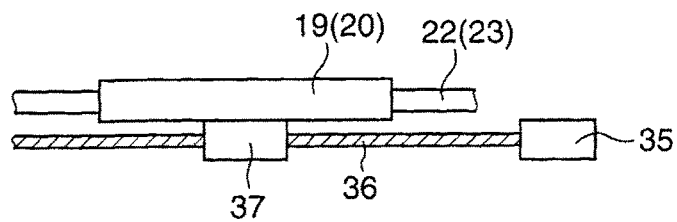
FIG. 2C is a side view schematically showing a modified configuration of the Y-direction motor and the X-direction motor in the moving mechanism shown in FIG. 2A.

FIG. 2A is a perspective view schematically showing a configuration of a moving mechanism of the stage shown in FIG. 1. FIG. 2B is a side view schematically showing a configuration of a Y-direction motor and an X-direction motor in the moving mechanism shown in FIG. 2A. FIG. 2C is a side view schematically showing a modified configuration of the Y-direction motor and the X-direction motor in the moving mechanism shown in FIG. 2A.

In FIG. 2A, a moving mechanism 18 of the stage 11 includes a Y-direction stage 19 which moves in a Y direction shown in FIG. 2A, a X-direction stage 20 which moves in an X direction shown in FIG. 2A, and a Z-direction moving unit 21 which moves in a Z direction shown in FIG. 2A. In FIG. 2A, X, Y and Z directions are orthogonal to one another.

The Y-direction stage 19 is driven in a high precision along a rail 22 arranged in the Y direction by the Y-direction motor and the X-direction stage 20 is driven in a high precision along a rail 23 arranged in the X direction by the X-direction motor. The stage 11 is arranged on the Z-direction moving unit 21 to be rotatable in a θ direction shown in FIG. 2A. The wafer W is mounted on the stage 11.

As shown in FIG. 2B, each of the Y-direction motor and the X-direction motor is a linear motor having a coil 33 and a magnet array 34, wherein the coil 33 is attached to the Y-direction stage 19 or the X-direction stage 20, and the magnet array 34 faces the coil 33 and is formed of N-pole permanent magnets and S-pole permanent magnets arranged alternately along the rail 22 or 23. Alternatively, as shown in FIG. 2C, each of the Y-direction motor and the X-direction motor may be a ball screw motor having a nut 37 and a ball screw 36, wherein the nut 37 is attached to the Y-direction stage 19 or the X-direction stage 20, and the ball screw 36 is coupled to the nut 37 and arranged parallel to the rail 22 or 23 and rotates on its axis by a rotation motor 35.

In the moving mechanism 18, the Y-direction stage 19, the X-direction stage 20 and the Z-direction moving unit 21 cooperatively move the wafer W to a position corresponding to the probe card 17, and make the solder bumps 27 of the semiconductor device formed on the wafer W contact with the respective probe electrodes 28 of the probe card 17.

The operations of the respective components of the prober 10 are controlled by a controller 29 (see FIG. 1) included in the prober 10 in accordance with a predetermined program and the like.

Next, the device test method will be described in accordance with the present embodiment.

Figure 3:
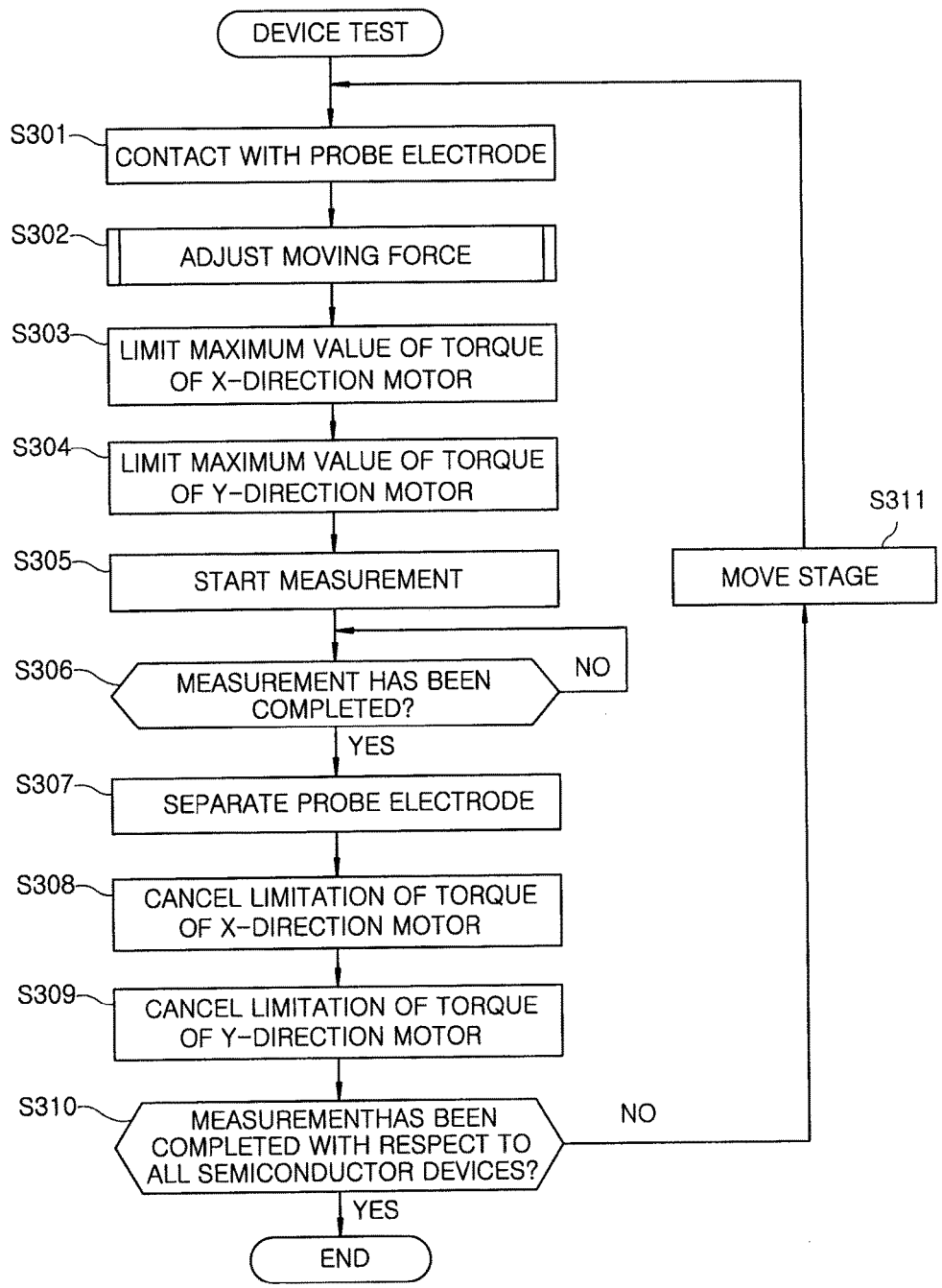
FIG. 3 is a flow chart showing the device test method in accordance with the embodiment.

FIG. 3 is a flow chart showing the device test method in accordance with the present embodiment. The device test method is performed by the controller 29.

First, in step S301, the relative positions of the probe card 17 and the wafer W are adjusted by the Y-direction stage 19 and the X-direction stage 20 to make each probe electrode 28 of the probe card 17 correspond to each solder bump 27 of the semiconductor device to be inspected in the wafer W. Thereafter, each solder bump 27 is made to contact with each probe electrode 28 by the Z-direction moving unit 21.

Next, a moving force adjustment process is performed by the Y-direction stage 19 and the X-direction stage 20 in step S302.

Figure 4:
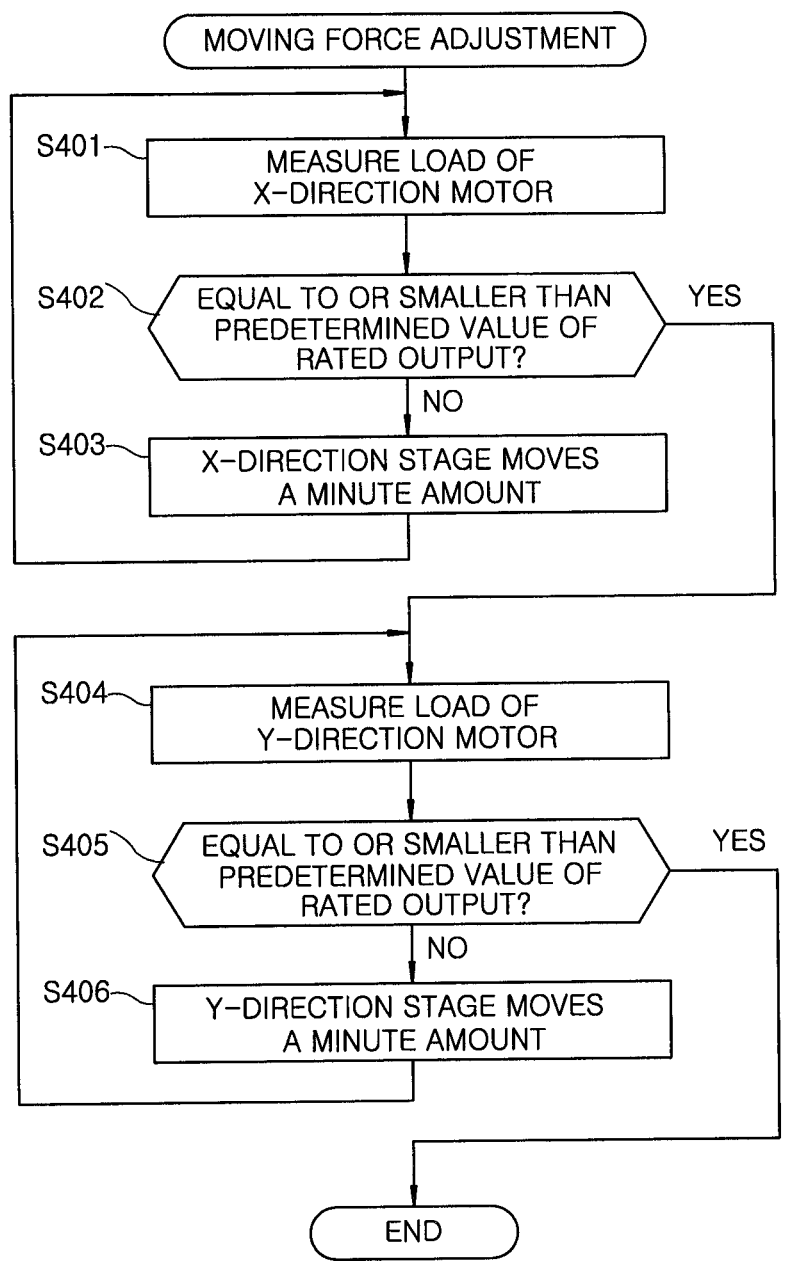
FIG. 4 is a flow chart showing a moving force adjustment process performed in the device test method of FIG. 3.

FIG. 4 is a flow chart showing the moving force adjustment process performed in step S302 of FIG. 3. The moving force adjustment process of FIG. 4 is carried out by the controller 29 of the prober 10.

In FIG. 4, first, when the solder bumps 27 of the semiconductor device are made to contact with the respective probe electrodes 28, load imposed on the X-direction motor is measured in step S401.

Figure 5A:
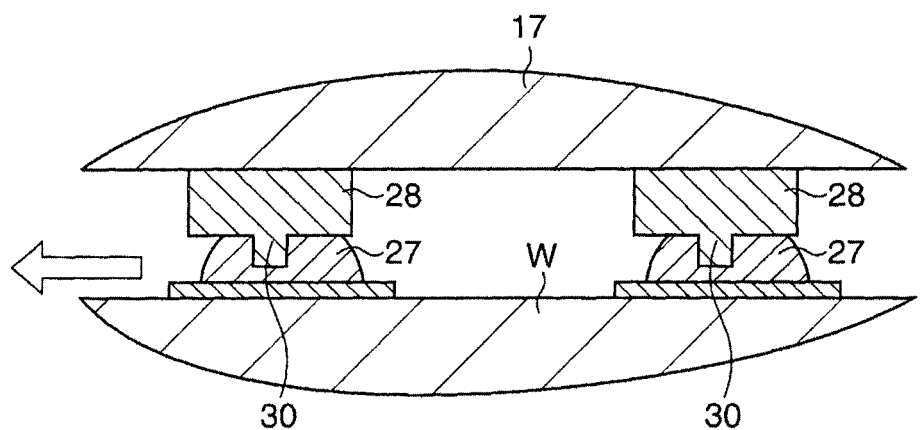
FIGS. 5A and 5B are process diagrams for explaining the moving force adjustment process of FIG. 4.

Herein, as shown in FIG. 5A, the wafer W on which the hemispherical solder bumps 27 are arranged is made, by the Z-direction moving unit 21, to approach the probe card 17 on which the columnar probe electrodes 28 are arranged, the columnar probe electrodes 28 protruding downward and each having at a leading end thereof a protuberant engagement part 30. Each probe electrode 28 is made to contact with each solder bump 27 so that each engagement part 30 is pushed into each solder bump 27. As a result, each probe electrode 28 is engaged with each solder bump 27 (electrode engagement step). At this time, a reaction force caused by a fine misalignment between the probe electrodes 28 and the corresponding solder bumps 27 is applied to the probe card 17 so that the probe card 17 is moved along a surface of the wafer W. Consequently, a moving force (see a white arrow in FIG. 5A) is applied to the solder bumps 27 to follow the movement of the probe card 17.

In response, the X-direction motor generates torque to offset an X-direction component of the moving force and the Y-direction motor generates torque to offset a Y-direction component of the moving force. In step S401, the load imposed on the X-direction motor, which generates the torque to offset the X-direction component of the moving force, is measured.

Figure 5B:
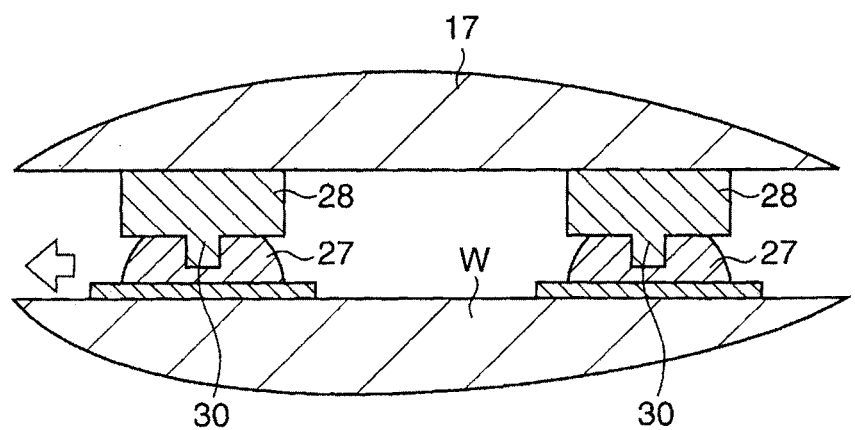

Next, it is determined in step S402 whether the load imposed on the X-direction motor is equal to or smaller than a few percent, e.g., 5%, of a rated output of the X-direction motor. If the load imposed on the X-direction motor is larger than 5% of the rated output (NO in step S402), the X-direction stage 20 moves a minute amount, e.g., 1 μm in a working direction of the moving force (step S403), and then the flow returns to step S401. Accordingly, the X-direction component of the moving force generated by the reaction force applied to the probe card 17 is reduced (see FIG. 5B). On the other hand, if the load imposed on the X-direction motor is equal to or smaller than 5% of the rated output (YES in step S402), the flow goes to step S404.

Thereafter, it is determined in step S405 whether the load imposed on the Y-direction motor, which generates torque to offset the Y-direction component, is equal to or smaller than several percent of a rated output of the Y-direction motor, e.g., 5% of the rated output. If the load imposed on the Y-direction motor is larger than 5% of the rated output (NO in step S405), the Y-direction stage 19 moves a minute amount, e.g., 1 μm in a working direction of the moving force in step S406, and then the flow returns to step S404. Accordingly, the Y-direction component of the moving force generated by the reaction force applied to the probe card 17 is reduced (see FIG. 5B). On the other hand, if the load imposed on the Y-direction motor is equal to or smaller than 5% of the rated output (YES in step S405), the process is terminated and the flow goes to step S303 of FIG. 3.

Next, the controller 29 limits a maximum value of the torque generated by the X-direction motor to a predetermined value or less, e.g., 15% or less of the rated output of the X-direction motor in step S303 (torque limiting step). Further, the controller 29 limits a maximum value of the torque generated by the Y-direction motor to a predetermined value or less, e.g., 15% or less of the rated output of the Y-direction motor in step S304 (torque limiting step).

Next, in step S305, the controller 29 allows a test current to flow from the test head 14 to the semiconductor device through the probe electrodes 28 of the probe card 17 and the solder bumps 27 and starts to measure the electrical characteristic of the semiconductor device.

Figure 6A:
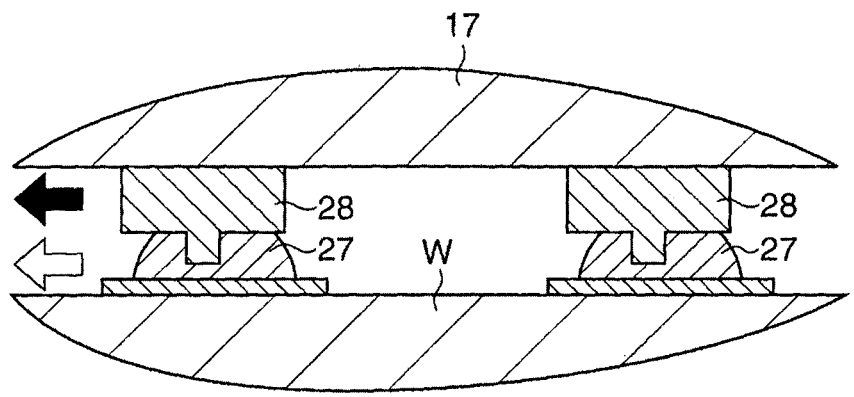
FIGS. 6A to 6C are process diagrams for explaining the effect of limiting a maximum value of torque of a motor in the device test method of FIG. 3.

At this time, the probe card 17 is thermally expanded by the heat generated by the flowing test current so that the probe card 17 moves along a surface of the wafer W (see a black arrow in FIG. 6A). As a result, a moving force (see a white arrow in FIG. 6A) is applied to the solder bumps 27 due to the movement of the probe card 17. In response, however, in order to keep the stage 11 from moving, the X-direction motor generates torque to offset the X-direction component of the moving force and the Y-direction motor generates torque to offset the Y-direction component of the moving force.

Figure 6B:
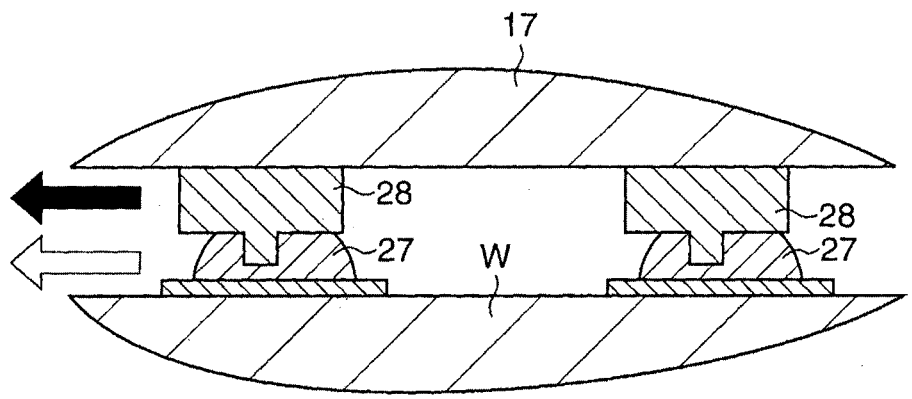
Figure 6C:
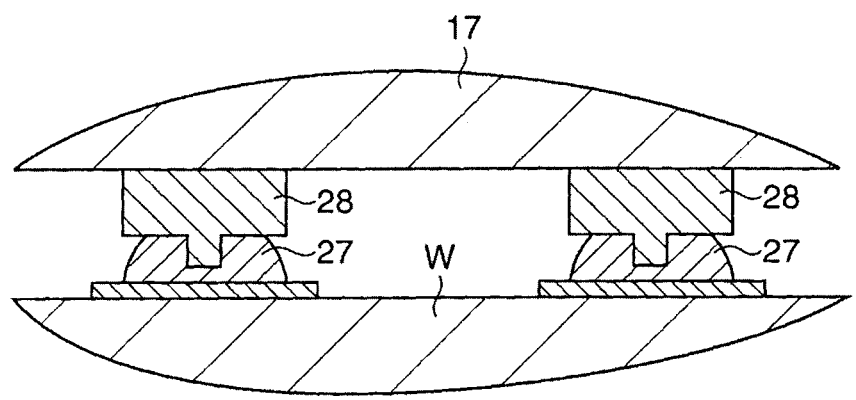

Here, maximum values of the torques generated in the X-direction motor and the Y-direction motor are limited to 15% or less of their own rated output. Therefore, in a case where a thermal expansion amount of the probe card 17 is not that great and the X-direction component and the Y-direction component of the moving force applied to the solder bumps 27 are 15% or less of the rated outputs of the X-direction motor and the Y-direction motor (see FIG. 6A), the moving force is canceled by the torque generated in the X-direction motor and the Y-direction motor, so that the stage 11 does not move. On the other hand, in a case where a thermal expansion amount of the probe card 17 is great and the X-direction component and the Y-direction component of the moving force applied to the solder bumps 27 are larger than 15% of the rated outputs of the X-direction motor and the Y-direction motor (see FIG. 6B), the moving force cannot be canceled by the torque generated in the X-direction motor and the Y-direction motor, so that the stage 11 is allowed to move. Then, the wafer W mounted on the stage 11 moves to follow the movement of the probe card 17, so that the moving force being applied to the solder bumps 27 is limited to a specific value or less and the engaged state of the probe electrodes 28 and the solder bumps 27 is maintained (see FIG. 6C).

Next, the controller 29 determines whether the electrical characteristic measurement of the semiconductor device has been completed or not (step S306). If the measurement has not been completed (NO in step S306), the flow returns to step S306. If the measurement has been completed (YES in step S306), the wafer W is moved away from the probe card 17 to separate the probe electrodes 28 from the solder bumps 27 (step S307).

Subsequently, the controller 29 cancels the limitation of the maximum value of the torque generated in the X-direction motor (step S308), and also cancels the limitation of the maximum value of the torque generated in the Y-direction motor (step S309). Further, in step S310, the controller 29 determines whether the electrical characteristic measurement has been completed with respect to all of the semiconductor devices on the wafer W.

As a result of the determination in step S310, if the electrical characteristic measurement has not been completed with respect to all of the semiconductor devices (NO in step S310), the stage 11 is moved by the Y-direction stage 19 and the X-direction stage 20 (step S311) to allow the probe electrodes 28 of the probe card 17 to correspond to the respective solder bumps 27 of a subsequent semiconductor device to be measured on the wafer W. If the electrical characteristic measurement has been completed with respect to all of the semiconductor devices (YES in step S310), the test of the semiconductor devices is terminated.

According to the device test method of FIG. 3, when the electrical characteristic of the semiconductor device is measured after the probe electrodes 28 are engaged with the solder bumps 27, the maximum values of torques generated by the X-direction motor and the Y-direction motor are limited to 15% or less of the rated outputs of the respective motors. Accordingly, in a case where the probe card 17 is thermally expanded and a moving force applied to the solder bumps 27 due to the thermal expansion exceeds 15% of the rated outputs of the respective motors, the X-direction motor and the Y-direction motor allow the movement of the stage 11. By doing so, load greater than a load value corresponding to 15% of the rated output is not generated in the X-direction motor and the Y-direction motor. As a result, it is possible to prevent the overload of the X-direction motor and the Y-direction motor for moving the stage 11.

In the aforementioned device test method, before the electrical characteristic of the semiconductor device is measured after the probe electrodes 28 are engaged with the solder bumps 27, the stage 11 is moved to limit a moving force applied to the solder bumps 27 to a specific value or less, the moving force being generated at the time of the engagement of the probe electrodes 28 with the solder bumps 27. Accordingly, it is possible to limit the moving force applied to the solder bumps 27 to the specific value or less during the measurement of the electrical characteristic of the semiconductor device.

In the aforementioned device test method, a maximum value of torque generated by the X-direction motor and the Y-direction motor is limited only in a case of measuring the electrical characteristic of the semiconductor device. Therefore, for example, when the stage 11 is moved to measure the electrical characteristic of a subsequent semiconductor device, each of the X-direction motor and the Y-direction motor can generates a large torque which allows the stage 11 to rapidly move, thereby improving throughput.

As such, the present invention has been described with respect to the above embodiment, but is not limited to the above embodiment.

Figure 7:
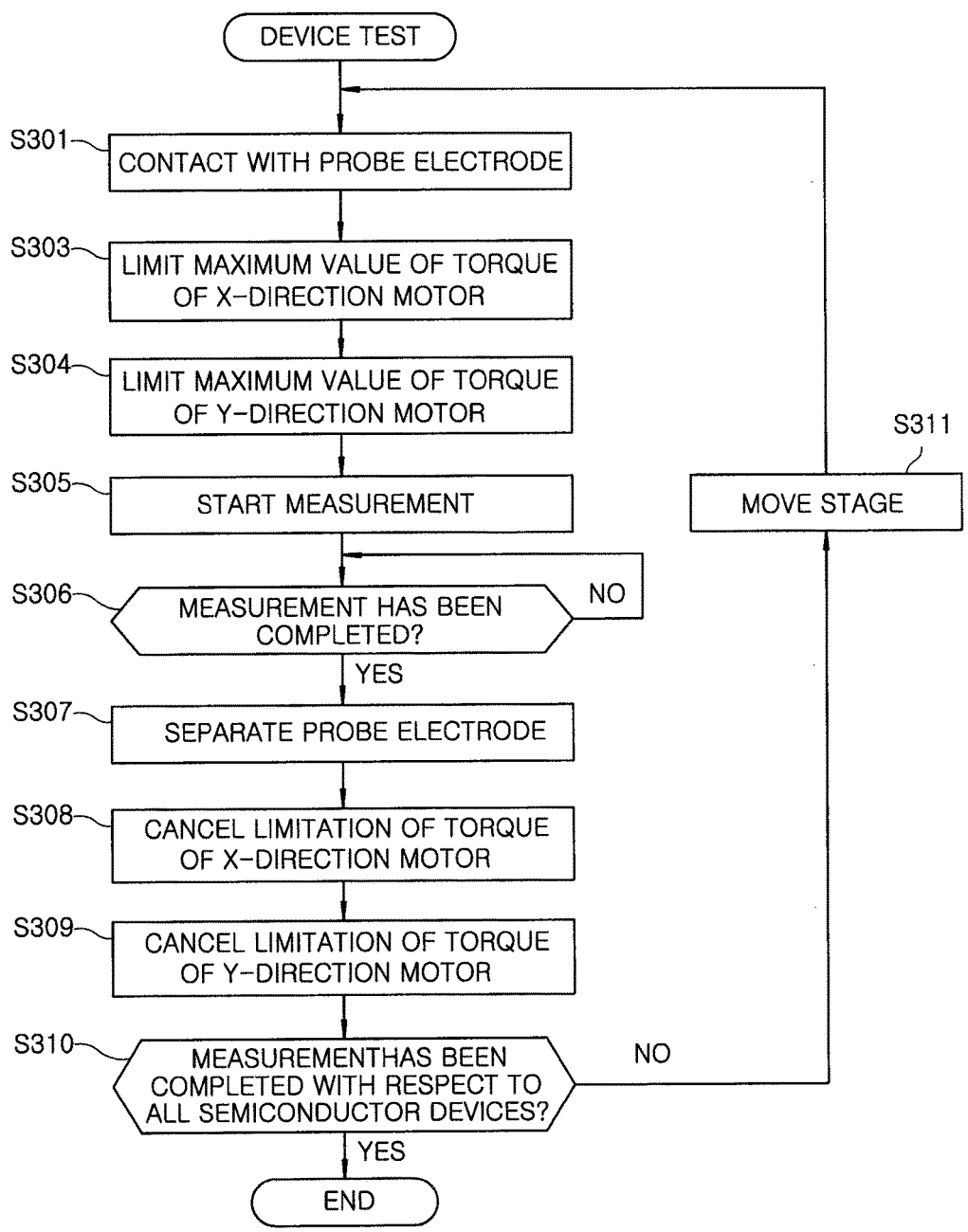
FIG. 7 is a flow chart showing a modified example of the device test method of FIG. 3.

For example, in the device test method of FIG. 3, the stage 11 is moved to limit the moving force applied to the solder bumps 27, which is generated at the time of the engagement of the probe electrodes 28 with the solder bumps 27, to the specific value or less by performing the moving force adjustment process of FIG. 4 before measuring the electrical characteristic of the semiconductor device. However, as shown in FIG. 7, the moving force adjustment process of step S302 may be removed from the device test method of FIG. 3 and the limitation of the maximum value of the torque in the X-direction motor and the Y-direction motor may be performed, and thereafter, the electrical characteristic of the semiconductor device may be measured. Also in this case, for example, when the X-direction component and the Y-direction component of the moving force applied to the solder bumps 27, which is generated at the time of the engagement of the probe electrodes 28 with the solder bumps 27, are greater than 15% of the rated outputs of the X-direction motor and the Y-direction motor, the moving force cannot be canceled by the torque generated by the X-direction motor and the Y-direction motor. Therefore, the stage 11 is allowed to move and thus the moving force applied to the solder bumps 27 can be limited to a certain value or less.

In the moving force adjustment process of FIG. 4, when the loads imposed on the X-direction motor and the Y-direction motor at the time of the engagement of the probe electrodes 28 with the solder bumps 27 are equal to or smaller than 5% of the rated outputs of the respective motors, the process of limiting the moving force applied to the solder bumps 27 to the specific value or less is not performed. However, even if the loads imposed on the X-direction motor and the Y-direction motor are equal to or smaller than 5% of the rated outputs of the respective motors, the moving force applied to the solder bumps 27 may be limited to a smaller value. Alternatively, the moving force applied to the solder bumps 27 may be eliminated regardless of the loads imposed on the X-direction motor and the Y-direction motor.

Figure 8:
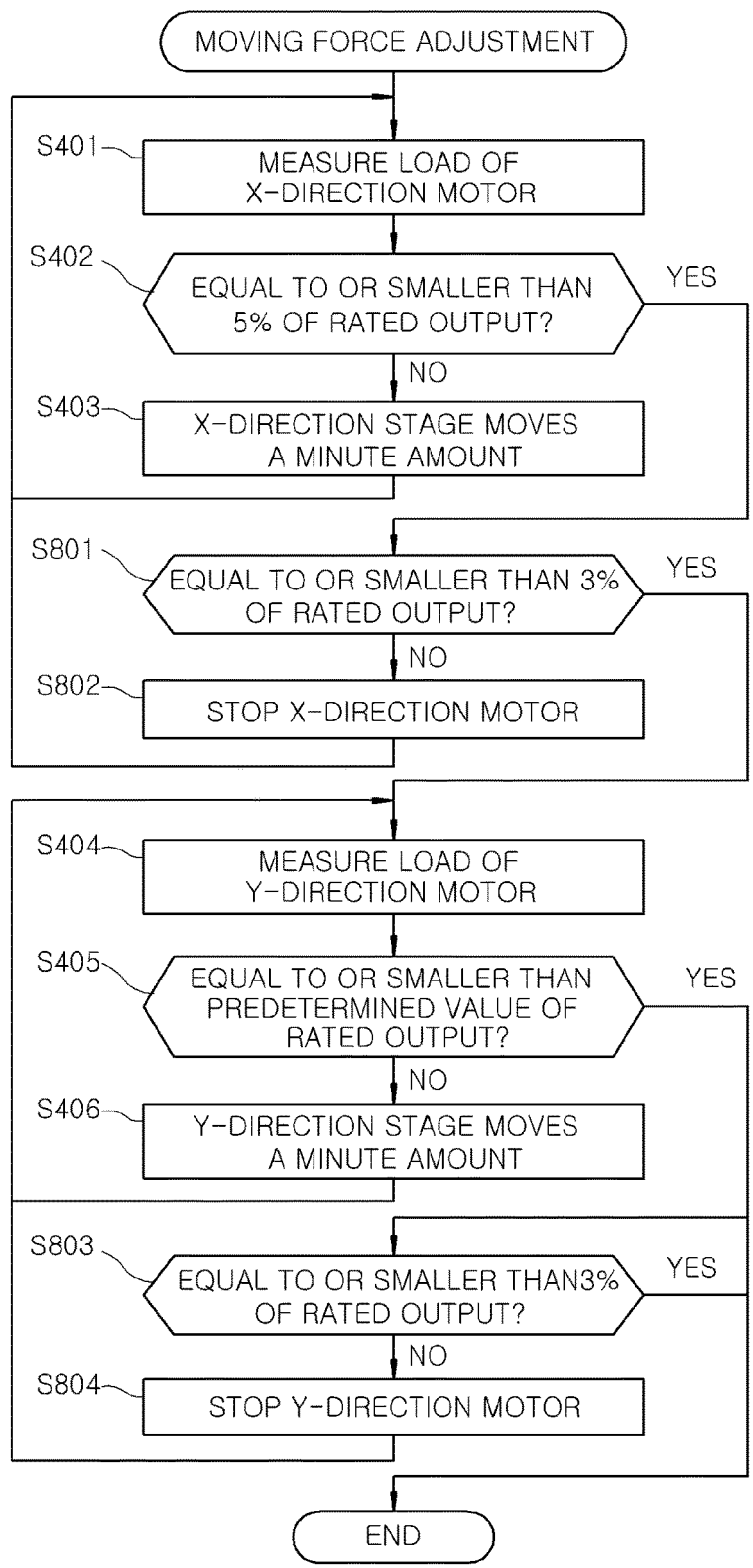
FIG. 8 is a flow chart showing a first modified example of the moving force adjustment process of FIG. 4.

FIG. 8 is a flow chart showing a first modified example of the moving force adjustment process of FIG. 4. In the following, redundant description on the same steps as those in the moving force adjustment process of FIG. 4 will be omitted.

In FIG. 8, if the load imposed on the X-direction motor is equal to or smaller than 5% of the rated output of the X-direction motor (YES in step S402), it is determined whether the load imposed on the X-direction motor is equal to or smaller than 3% of the rated output (step S801). If the load imposed on the X-direction motor is equal to or smaller than 5% of the rated output and larger than 3% of the rated output (NO in step S801), the X-direction motor is stopped (step S802) and the flow returns to step S401. At this time, since the X-direction motor does not generate torque, the wafer W moves in the X-direction by the X-direction component of the moving force applied to the solder bumps 27 to cancel the X-direction component of the moving force.

On the other hand, if the load imposed on the X-direction motor is equal to or smaller than 3% of the rated output (YES in step S801), the flow goes to step S404 and then step S405. If the load imposed on the Y-direction motor is equal to or smaller than 5% of the rated output of the Y-direction motor (YES in step S405), it is determined whether the load imposed on the Y-direction motor is equal to or smaller than 3% of the rated output (step S803).

As a determination result in step S803, if the load imposed on the Y-direction motor is equal to or smaller than 5% of the rated output and larger than 3% of the rated output (NO in step S803), the Y-direction motor is stopped (step S804) and the flow returns to step S404. At this time, since the Y-direction motor does not generate torque, the wafer W moves in the Y-direction by the Y-direction component of the moving force applied to the solder bumps 27 to cancel the Y-direction component of the moving force.

On the other hand, if the load imposed on the Y-direction motor is equal to or smaller than 3% of the rated output (YES in step S803), the process is terminated.

Figure 9:
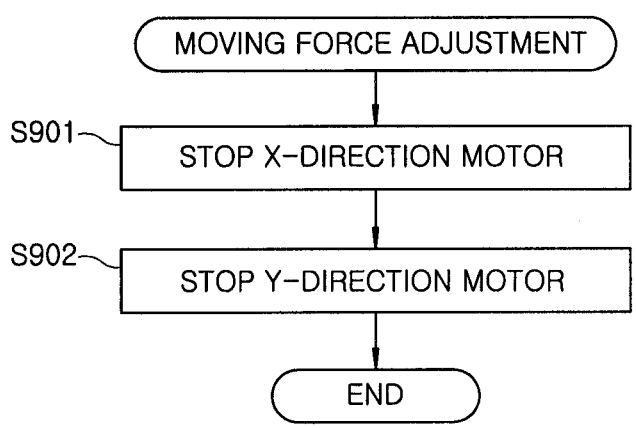
FIG. 9 is a flow chart showing a second modified example of the moving force adjustment process of FIG. 4.

FIG. 9 is a flow chart showing a second modified example of the moving force adjustment process of FIG. 4.

In the process of FIG. 9, regardless of the loads imposed on the X-direction motor and the Y-direction motor, the X-direction motor is stopped in step S901 and the Y-direction motor is stopped in step S902. Thereafter, the process is terminated. In the process of FIG. 9, since the X-direction motor and the Y-direction motor do not generate torque, the wafer W moves in the X-direction and the Y-direction by the X-direction component and the Y-direction component of the moving force applied to the solder bumps 27 to cancel the X-direction component and the Y-direction component of the moving force.

Figure 10A:
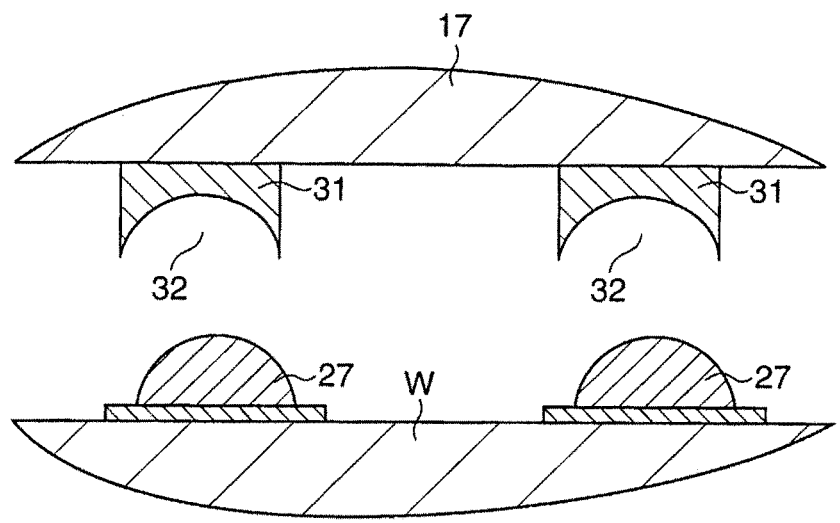
FIGS. 10A to 10C are process diagrams for explaining reduction of an excessive moving force in a case of using a modified example of a probe card in FIG. 2A.

Each of the probe electrodes 28 on the aforementioned probe card 17 protrudes downward from the probe card 17 and is a columnar electrode having at a leading end thereof the protuberant engagement part 30. However, the shape of the probe electrode is not limited thereto. For example, as shown in FIG. 10A, a probe electrode 31 may be a columnar electrode having at a leading end thereof a hemispheric depressed portion 32 which is engageable with the solder bump 27.

Figure 10B:
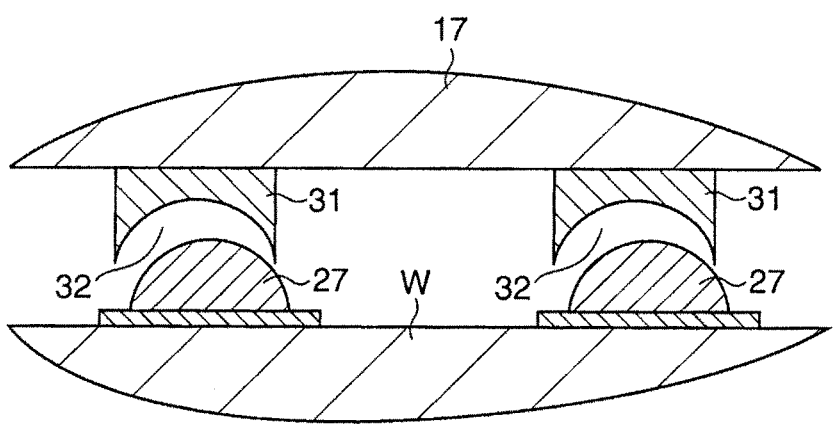
Figure 10C:
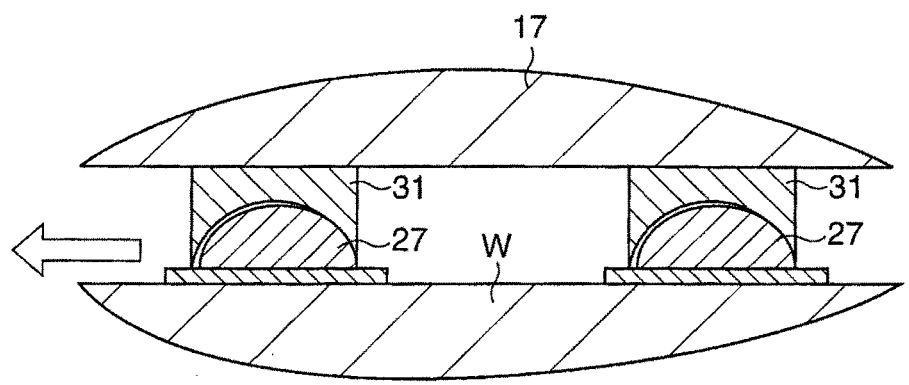

Also in this case, when the probe electrodes 31 are engaged with the solder bumps 27 (see FIG. 10B), a reaction force due to a fine misalignment between the probe electrodes 28 and the corresponding solder bumps 27 is applied to the probe card 17. As a result, as shown in FIG. 10C, a moving force (see a white arrow in FIG. 10C) is applied to the solder bumps 27 to follow the movement of the probe card 17. At this time, however, an excessive moving force can be limited to a specific value or less by performing the moving force adjustment process of FIG. 4.

Figure 11A:
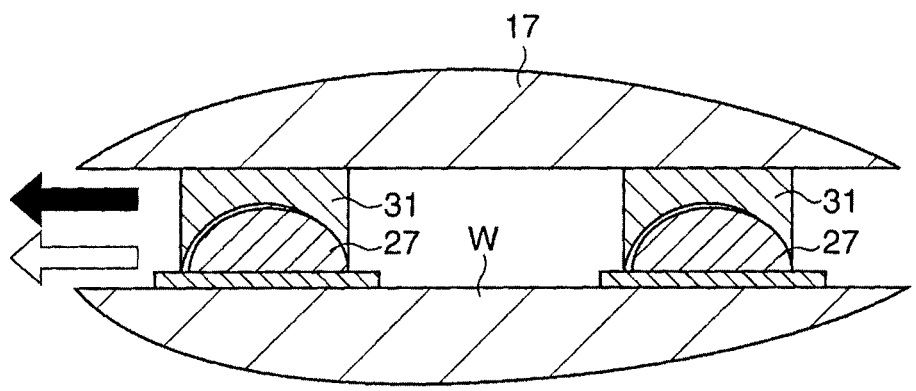
FIGS. 11A and 11B are process diagrams for explaining a process in which a moving force is generated on each solder bump in a case of using a modified example of the probe card in FIG. 2A.
Figure 11B:
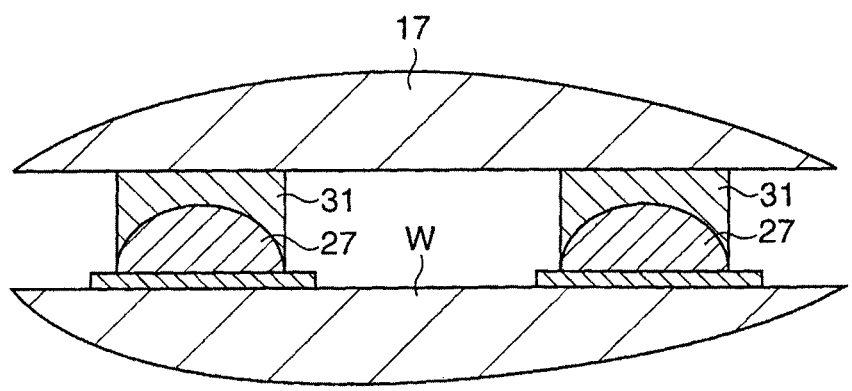
Figure 12:
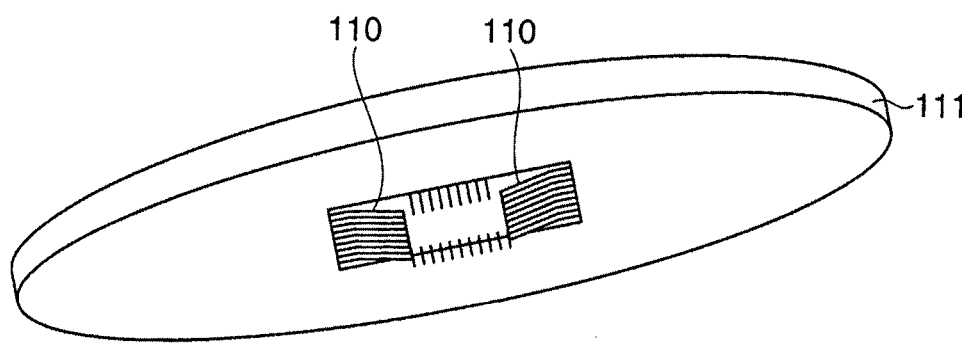
FIG. 12 is a perspective view schematically showing a configuration of a disk-shaped probe card having cantilever-type probe needles.
Figure 13:
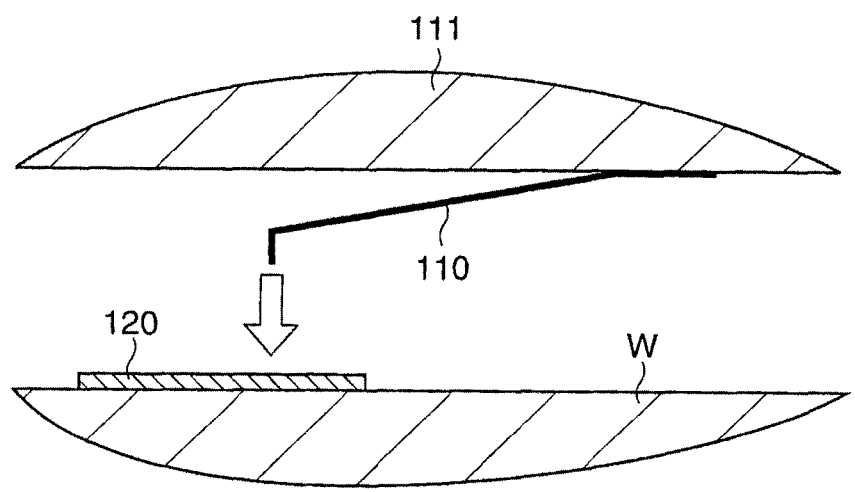
FIG. 13 is a cross-sectional view showing a process in which a probe needle of the probe card shown in FIG. 12 is made contact with an electrode pad of a device on a wafer.
Figure 14A:
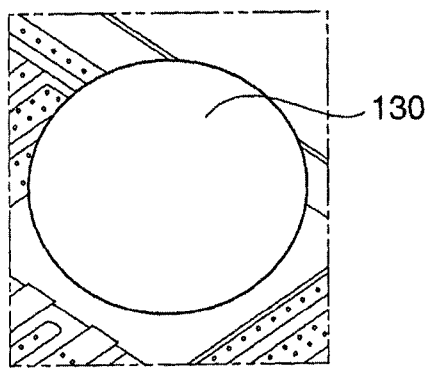
FIG. 14A is an enlarged perspective view for explaining a solder bump in a device.
Figure 14B:
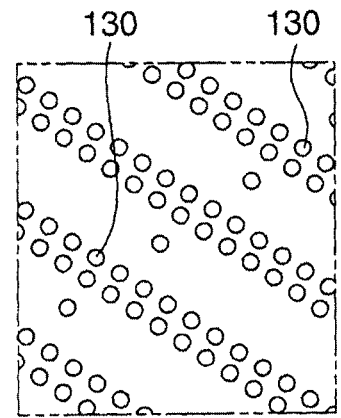
FIG. 14B is a view showing the arrangement of each solder bump in a device.
Figure 15A:
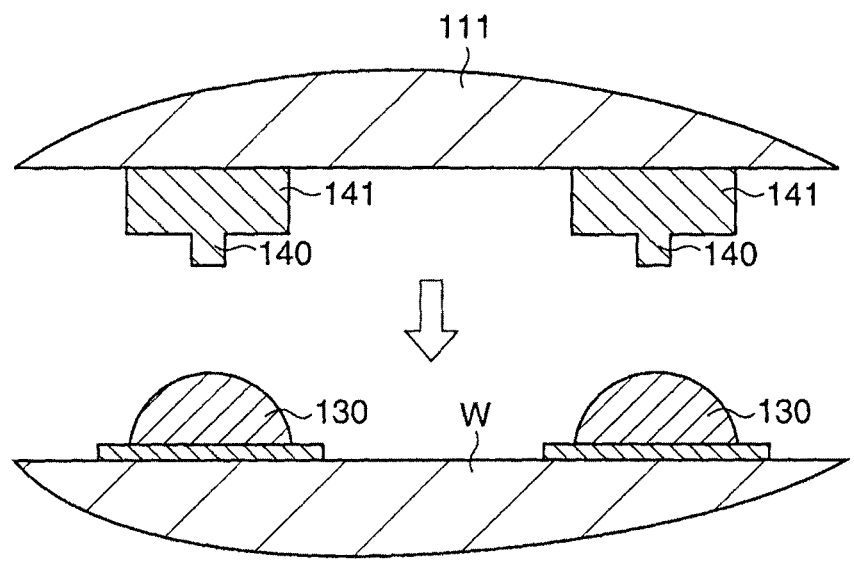
FIG. 15A to 15C are process diagrams for explaining a process in which a moving force is generated on each solder bump in a conventional prober.
Figure 15B:
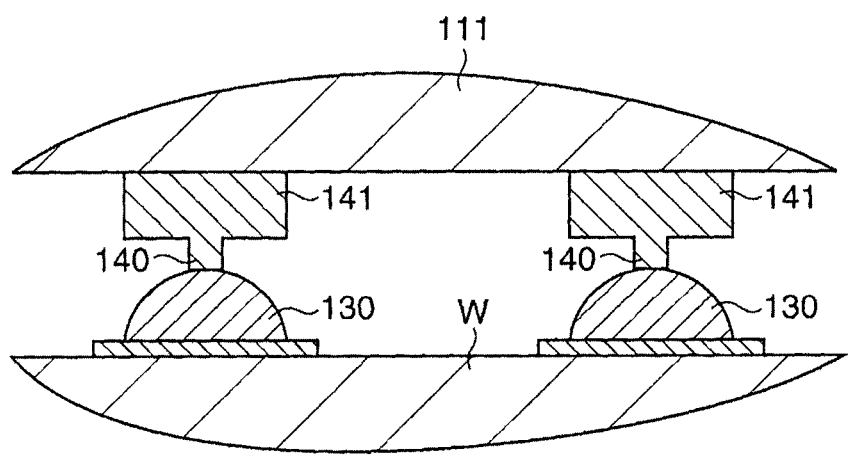
Figure 15C:
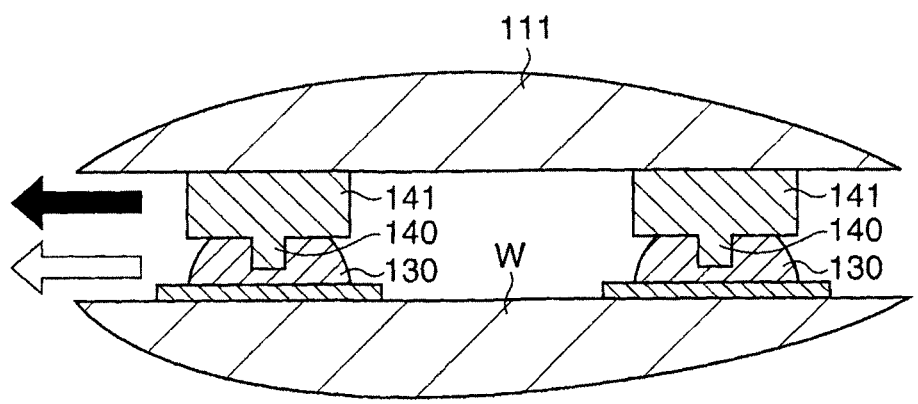

Also when the electrical characteristic of a semiconductor device is measured by allowing a test current to flow in the semiconductor device, the X-direction motor and the Y-direction motor generate torques to offset the moving force (see a white arrow in FIG. 11A) applied to the solder bumps 27, thereby imposing loads on the motors, the moving force being generated by a movement of the probe card 17 due to a thermal expansion of the probe card 17 (see a black arrow in FIG. 11A). At this time, however, by limiting a maximum value of each of the torques generated by the X-direction motor and the Y-direction motor to a predetermined value or less by performing the device test method of FIG. 3, the stage 11 is allowed to move (see FIG. 11B) when a large moving force is generated. Therefore, each of loads on the X-direction motor and the Y-direction motor can be limited to a predetermined load value or less.

In the above-described device test method of FIG. 3, the maximum values of the torques generated by the X-direction motor and the Y-direction motor are limited to 15% or less of the rated outputs of the respective motors. However, the limitation of the maximum values of the torques is not limited to the above value. For example, the maximum values of the torques may be limited to 100% or less of the rated outputs of the respective motors. If the X-direction motor and the Y-direction motor successively generate torques of 100% or less of the rated outputs, there is almost no possibility that the X-direction motor and the Y-direction motor are damaged. Accordingly, by doing so, a concern about damage of the X-direction motor and the Y-direction motor can be removed.

In the prober 10, the X-direction motor and the Y-direction motor are linear motors. However, the X-direction motor and the Y-direction motor may be rotation motors that rotate ball screws. In this case, the X-direction motor and the Y-direction motor move the X-direction stage 20 and the Y-direction stage 19 in the X-direction and the Y-direction by rotating the ball screws arranged in the X-direction and the Y-direction, respectively. Even if such rotation motors are used, the device test method of FIG. 3 and the moving force adjustment process of FIG. 4 can be applied.

The object of the present invention may also be achieved by providing, to a computer, e.g., to the controller 29, a storage medium in which program codes of software for implementing functions of the above-described embodiment are stored, and by reading out and executing the program codes stored in the storage medium by using a CPU of the controller 29.

In this case, the program codes themselves read out from the storage medium implement the functions of the above-described embodiment. Therefore, the program codes and the storage medium in which the program codes are stored constitute the present invention.

The storage medium for supplying the program codes may be one that can store the program codes, e.g., may be RAM (random-access memory), NV-RAM (non-volatile random access memory), a Floppy™ disk, a hard disk, an optical magnetic disk, an optical disk such as CD-ROM (compact disc read-only memory), CD-R (compact disc recordable), CD-RW (compact disc rewritable) and DVD (digital versatile disc) (DVD-ROM, DVD-RAM, DVD–RW or DVD+RW), a magnetic tape, a nonvolatile memory card, other ROMs or the like. Alternatively, the program codes may be supplied to the controller 29 by being downloaded from a computer (not shown), database (not shown) or the like connected to a local area network or the like.

The function of the above embodiment is realized by executing the program codes read out by the controller 29. Further, based on the instruction of the program codes, OS (operating system) or the like being operated on CPU may perform a part or the whole of a real process and the function of the above embodiment may be realized by the process.

Furthermore, the program codes read out from the storage medium may be written to a memory included in a function extension board inserted in the controller 29 or a function extension unit connected to the controller 29. Then, based on the instruction of the program codes, CPU or the like included in the function extension board or the function extension unit may perform a part or the whole of a real process and the function of the above embodiment may be realized by the process.

The program codes may have a form of object codes, program codes executed by an interpreter, script data supplied to the OS, or the like.

The present application claims priority based on Japanese Patent Application No. 2013-176845 filed on Aug. 28, 2013, the entire contents of which are incorporated herein by reference.

DESCRIPTION OF REFERENCE NUMERALS

W wafer
10 prober
11 stage
17 probe card
19 Y-direction stage
20 X-direction stage
21 Z-direction moving unit
27 solder bump
28, 31 probe electrode
29 controller
30 engagement part

What is claimed is:

1. A device test method performed in a substrate test apparatus which comprises: a mounting table for mounting thereon a substrate on which a device having an electrode is formed, the mounting table being movable by at least one motor; a probe card arranged to face the mounting table; and a controller, wherein a measuring electrode is arranged to correspond to the electrode of the device, the probe card comprises a probe that is engageable with the measuring electrode, and wherein the at least one motor is operable to generate torque to prevent the mounting table from moving during measuring an electrical characteristic of the device, the device test method comprising:

(a) engaging the probe with the measuring electrode;
(b) causing the at least one motor to generate a torque to offset a moving force applied to the measuring electrode before measuring an electrical characteristic of the device and after the engaging, wherein the moving force is generated due to a misalignment between the probe and the measuring electrode upon engagement of the probe with the measuring electrode; and
(c) limiting to a predetermined value or less a maximum value of the torque generated by the at least one motor during measuring the electrical characteristic of the device after the causing the at least one motor to generate the torque, wherein the causing the at least one motor to generate the torque comprises: comparing, by the controller, a load imposed to the at least one motor generating the torque to offset the moving force with a reference value of a rated output of the at least one motor and moving the mounting table to reduce the moving force if the load is larger than the reference value, wherein the limiting comprises allowing, by the controller, the mounting table to move if the moving force applied to the measuring electrode is larger than the predetermined value of the rated output of the at least one motor, wherein the predetermined value is larger than the reference value, and wherein the maximum value of the torque generated by the at least one motor is limited to be larger than the reference value and equal to or smaller than the predetermined value, wherein the mounting table is configured to be movable in each of a first direction and a second direction that are orthogonal to each other on a horizontal plane, wherein the at least one motor of the substrate test apparatus comprises motors configured for moving the mounting table in the first direction and the second direction, wherein the moving force has a first-direction component toward the first direction and a second-direction component toward the second direction, and wherein the causing the at least one motor to generate a torque further comprises moving the mounting table in each of the first direction and the second direction to reduce the first-direction component and the second-direction component of the moving force.

2. The device test method of claim 1, further comprising: canceling limitation of the maximum value of the torque after measuring the electrical characteristic of the device.

3. The device test method of claim 1, further comprising: after the engaging and before measuring the electrical characteristic of the device, moving the mounting table to limit to a specific value or less the moving force which is generated and applied to the measuring electrode upon the engagement of the probe with the measuring electrode.

4. The device test method of claim 1, wherein the measuring electrode is an electrode pad or a solder bump, and the probe comprises a protuberant member that is engageable with the measuring electrode.

5. The device test method of claim 1, wherein the predetermined value is equal to or less than 100% of the rated output of the at least one motor.

6. The device test method of claim 1, wherein the at least one motor comprises a linear motor which is relatively moved with respect to a rail.

7. The device test method of claim 1, wherein the at least one motor is configured to move the mounting table through a ball screw.

* * * * *